United States Patent
Fukiage (10) Patent No.: US 7,371,436 B2
(45) Date of Patent: May 13, 2008

(54) METHOD AND APPARATUS FOR DEPOSITING MATERIALS WITH TUNABLE OPTICAL PROPERTIES AND ETCHING CHARACTERISTICS

(75) Inventor: Noriaki Fukiage, Hartsdale, NY (US)

(73) Assignee: Tokyo Electron Limited (JP)

( * ) Notice: Subject to any disclaimer, the term of this patent is extended or adjusted under 35 U.S.C. 154(b) by 433 days.

(21) Appl. No.: 10/644,958

(22) Filed: Aug. 21, 2003

(65) Prior Publication Data

US 2005/0039681 A1    Feb. 24, 2005

(51) Int. Cl.
*H05H 1/24*    (2006.01)
(52) U.S. Cl. .................................. 427/569
(58) Field of Classification Search .............. None
See application file for complete search history.

(56) References Cited

U.S. PATENT DOCUMENTS

| | | | |
|---|---|---|---|
| 4,960,488 A | 10/1990 | Law et al. | |
| 5,669,976 A | 9/1997 | Yuuki et al. | |
| 6,635,575 B1 * | 10/2003 | Xia et al. ................. | 438/697 |
| 6,869,542 B2 * | 3/2005 | Desphande et al. .......... | 216/51 |
| 2003/0039951 A1 | 2/2003 | Cheung et al. | |
| 2003/0109147 A1 | 6/2003 | Kim et al. | |

FOREIGN PATENT DOCUMENTS

JP    09-148322    6/1997

OTHER PUBLICATIONS

Andosca et al. (J.App. Phys. 72(3) Aug. 1, 1992 pp. 1126-1132).*
Kudoh et al., "Directional Plasma CVD Technology for Sub-Quarter Micrometer Feature Size Multilevel Interconnection," 1997 International Conference on Solid State Devices and Materials, Japan Society of Applied Physics (Hamamasu), p. 290-291, (Sep. 1997).
Andosca, R.G. et al., "Silicon dioxide films deposited by electron cyclotron resonance plasma enhanced chemical vapor deposition," Journal of Applied Physics, vol. 72 (No. 3), p. 1126-1132, (Aug. 1, 1992).

\* cited by examiner

*Primary Examiner*—Timothy Meeks
*Assistant Examiner*—Kelly M Stouffer (57) ABSTRACT

A method and system for depositing a film with tunable optical and etch resistant properties on a substrate by plasma-enhanced chemical vapor deposition. A chamber has a plasma source and a substrate holder coupled to a RF source. A substrate is placed on the substrate holder. The TERA layer is deposited on the substrate. The amount of RF power provided by the RF source is selected such that the rate of deposition of at least one portion of the TERA layer is greater than when no RF power is applied the substrate holder.

58 Claims, 4 Drawing Sheets

METHOD AND APPARATUS FOR DEPOSITING MATERIALS WITH TUNABLE OPTICAL PROPERTIES AND ETCHING CHARACTERISTICS

FIELD OF THE INVENTION

The present invention relates to using a plasma-enhanced chemical vapor deposition (PECVD) system to deposit thin-film materials with tunable optical and etching characteristics.

BACKGROUND OF THE INVENTION

Integrated circuit and device fabrication requires deposition of electronic materials on substrates. The deposited film may be a permanent part of the substrate or finished circuit. In this case, the film characteristics are chosen to provide the electrical, physical, or chemical properties required for circuit operation. In other cases, the film may be employed as a temporary layer that enables or simplifies device or circuit fabrication. For example, a deposited film may serve as a mask for subsequent etching processes. The etch-resistant film may be patterned such that it covers areas of the substrate are not to be removed by the etch process. A subsequent process may then remove the etch-resistant film in order to allow further processing of the substrate.

In another example of a temporary layer, a film may be employed to enhance a subsequent lithographic patterning operation. In one embodiment, a film with specific optical properties is deposited on a substrate, after which the film is coated with a photosensitive imaging film commonly referred to as photoresist. The photoresist is then patterned by exposure to light. The optical properties of the underlying deposited film are chosen to reduce reflection of the exposing light, thereby improving the resolution of the lithographic process. Such a film is commonly referred to as an anti—reflective coating (henceforth: ARC). Methods for using and fabricating vapor deposited materials with tunable optical properties are presented in U.S. Pat. No. 6,316,167.

Various physical and/or chemical deposition techniques are routinely employed for film deposition, and often more than one technique may be used to deposit a particular film. The preferred deposition method is determined by considering the desired film properties, physical and/or chemical constraints imposed by the device being fabricated, and economic factors associated with the manufacturing process. The selected process is often the one that provides an acceptable trade-off to address the pertinent technical and economic concerns.

Thermally excited chemical vapor deposition (henceforth: CVD) is a common technique used to deposit materials for integrated circuit fabrication. In a typical embodiment, a substrate is placed in a low-pressure reactor and maintained at a controlled temperature. The wafer is exposed to gaseous ambient of one or more precursors that contain the chemical elements to be incorporated in the film. The gaseous precursors are transported to the substrate surface and combine via one or more chemical reactions to form a solid film. The conditions of the reactor chamber, substrate, and precursor are typically chosen to favor chemical reactions that produce films with the desired physical, chemical, and electrical properties.

A plasma can be employed to alter or enhance the film deposition mechanism. A deposition process that employs a plasma is generally referred to as a plasma-enhanced chemical vapor deposition (henceforth: PECVD). In general, a plasma is formed in a vacuum reactor by exposing a gas mixture to an RF signal and exciting electrons to energies sufficient to sustain ionizing collisions with a supplied process gas. Moreover, the excited electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber.

Plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

SUMMARY OF THE INVENTION

The present invention relates to deposition in a PECVD system, and more particularly, to the deposition of a Tunable Etch Resistant ARC (TERA) layer. The present invention provides a method for depositing a TERA layer on a substrate, comprising: providing a chamber having an upper electrode coupled to a first RF source and a translatable substrate holder coupled to a second RF source; placing a substrate on the translatable substrate holder; depositing the TERA layer on the substrate, wherein the physical, chemical, or optical properties of at least one portion of the TERA layer is dependent upon the amount of RF power provided by the second RF source; and wherein the deposition rate of at least one portion of the TERA layer is dependent upon the amount of RF power provided by the second RF source.

DETAILED DESCRIPTION OF SEVERAL EMBODIMENTS

Figure 1:
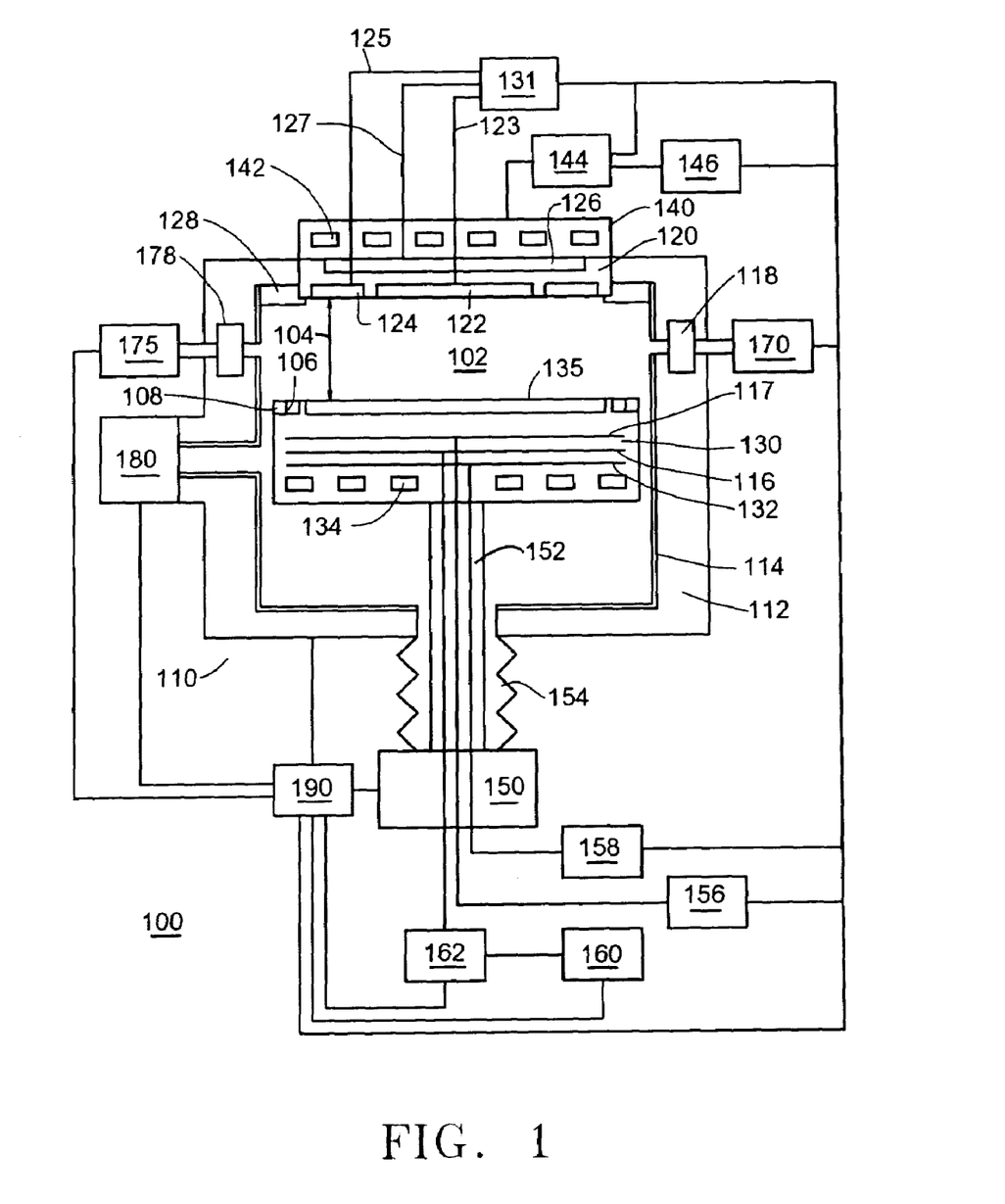
FIG. 1 illustrates a simplified block diagram for a PECVD system in accordance with an embodiment of the present invention.

FIG. 1 illustrates a simplified block diagram for a PECVD system in accordance with an embodiment of the present invention. In the illustrated embodiment, PECVD system 100 comprises processing chamber 110, upper electrode 140 as part of a capacitively coupled plasma source, shower plate assembly 120, substrate holder 130 for supporting substrate 135, pressure control system 180, and controller 190.

In one embodiment, PECVD system 100 can comprise a dry pump 170 that can be coupled to the processing chamber 110 using a valve 118. Alternately, 118 can comprise a pressure control system incorporating a pressure gauge and throttle valve (not shown). In an alternate embodiment, a dry pump and valve are not required.

In one embodiment, PECVD system 100 can comprise a remote plasma system 175 that can be coupled to the processing chamber 110 using a valve 178. In an alternate embodiment, a remote plasma system and valve are not required.

In one embodiment, PECVD system 100 can comprise a pressure control system 180 that can be coupled to the processing chamber 110. For example, the pressure control system 180 can comprise a throttle valve (not shown) and a turbomolecular pump (TMP) (not shown) and can provide a controlled pressure in processing chamber 110. For example, the chamber pressure can range from approximately 0.1 mTorr to approximately 100 Torr. Alternatively, the chamber pressure can range from 0.1 Torr to 20 Torr.

Processing chamber 110 can facilitate the formation of a plasma in process space 102 adjacent substrate 135. PECVD system 100 can be configured to process substrates of any diameter, such as 200 mm substrates, 300 mm substrates, or larger substrates. Alternately, the PECVD system 100 can operate by generating plasma in one or more processing chambers.

PECVD system 100 comprises a shower plate assembly 120 coupled to the processing chamber 110. Shower plate assembly is mounted opposite the substrate holder 130. Shower plate assembly 120 comprises a center region 122, an edge region 124, and a sub region 126. Shield ring 128 can be used to couple shower plate assembly 120 to processing chamber 110.

Center region 122 is coupled to gas supply system 131 by a first process gas line 123. Edge region 124 is coupled to gas supply system 131 by a second process gas line 125. Sub region 126 is coupled to gas supply system 131 by a third process gas line 127.

Gas supply system 131 provides a first process gas to the center region 122, a second process gas to the edge region 124, and a third process gas to the sub region 126. The gas chemistries and flow rates can be individually controlled to these regions. Alternately, the center region and the edge region can be coupled together as a single primary region, and gas supply system can provide the first process gas and/or the second process gas to the primary region. In fact, any of the regions can be coupled together and the gas supply system can provide one or more process gasses as appropriate.

The first process gas can comprise at least one of a silicon-containing precursor and a carbon-containing precursor. For example, the silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS),and tetramethylcyclotetrasilane (TMCTS). The carbon-containing precursor can comprise at least one of $CH_4$, $C_2H_4$, $C_2H_2$, $C_6H_6$ and $C_6H_5OH$. An inert gas can also be included, such as argon, helium, and/or nitrogen. The flow rate for the silicon-containing precursor and the carbon-containing precursor can range from approximately 0.0 sccm to approximately 5000 sccm and the flow rate for the inert gas ranges from approximately 0.0 sccm to approximately 10000 sccm.

Also, the second process gas can comprise at least one of a silicon-containing precursor and a carbon-containing precursor. For example, the silicon-containing precursor comprises at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor comprises at least one of $CH_4$, $C_2H_4$, $C_2H_2$, $C_6H_6$ and $C_6H_5OH$. An inert gas can also be included, such as argon, helium, and/or nitrogen. The flow rate for the silicon-containing precursor and carbon-containing precursor can range from approximately 0.0 sccm to approximately 5000 sccm and the flow rate for the inert gas ranges from approximately 0.0 sccm to approximately 10000 sccm.

In addition, the third process gas can comprise at least one of an oxygen containing gas, a nitrogen containing gas, a carbon-containing gas, and an inert gas. For example, the oxygen containing gas can comprise at least one of $O_2$, CO, NO, $N_2O$, and $CO_2$; the nitrogen containing gas can comprise at least one of $N_2$, and $NF_3$; and the inert gas can comprise at least one of Ar, and He. The flow rate for the third process gas can range from approximately 0.0 sccm to approximately 10000 sccm.

The gas supply system 131 can comprise at least one vaporizer (not shown) for providing precursors. Alternately, a vaporizer is not required. In an alternate embodiment, a bubbling system can be used.

PECVD system 100 comprises an upper electrode 140 that can be coupled to shower plate assembly 120 and coupled to the processing chamber 110. Upper electrode 140 can comprise temperature control elements 142. Upper electrode 140 can be coupled to a first RF source 146 using a first match network 144. Alternatively, a separate match network is not required.

A first RF source 146 provides a top RF signal (TRF) to the upper electrode, and the first RF source 146 can operate in a frequency range from approximately 0.1 MHz. to approximately 200 MHz. For example, deposition processes have been performed at approximately each of the following: 100 MHz, 60 MHz, 27 MHz, and 13.56 MHz. The TRF signal can be in the frequency range from approximately 1 MHz. to approximately 100 MHz, or alternatively in the frequency range from approximately 2 MHz. to approximately 60 MHz. The first RF source 146 can operate in a power range from approximately 10 watts to approximately 10000 watts, or alternatively, the first RF source can operate in a power range from approximately 10 watts to approximately 5000 watts.

Upper electrode 140 and RF source 146 are parts of a capacitively coupled plasma source. The capacitively couple plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, and a surface wave plasma source. As is well known in the art, upper electrode 140 may be eliminated or reconfigured in the various suitable plasma sources.

Substrate 135 can be, for example, transferred into and out of processing chamber 110 through a gate valve (not shown) and chamber feed-through (not shown) via robotic substrate transfer system (not shown), and it can be received by substrate holder 130 and mechanically translated by devices coupled thereto. Once substrate 135 is received from substrate transfer system, substrate 135 can be raised and/or lowered using a translation device 150 that can be coupled to substrate holder 130 by a coupling assembly 152.

Substrate 135 can be affixed to the substrate holder 130 via an electrostatic clamping system. For example, an electrostatic clamping system can comprise an electrode 117 and an ESC supply 156. Clamping voltages, that can range from approximately −2000 V to approximately +2000 V, for example, can be provided to the clamping electrode. Alternatively, the clamping voltage can range from approximately −1000 V to +1000 V. In alternate embodiments, gas can, for example, be delivered to the backside of substrate 135 via a backside gas system to improve the gas-gap thermal conductance between substrate 135 and substrate holder 130. In other alternate embodiments, lift pins can be provided in substrate holder 130.

A temperature control system can also be provided. Such a system can be utilized when temperature control of the substrate is required at elevated or reduced temperatures. For example, a heating element 132, such as resistive heating elements, or thermoelectric heaters/coolers can be included, and substrate holder 130 can further include a cooling system 134. Heating element 132 can be coupled to heater supply 158. Cooling system 134 can provide a re-circulating coolant flow that receives heat from substrate holder 130 and transfers heat to a heat exchanger system (not shown), or when heating, transfers heat from the heat exchanger system.

Also, a lower electrode 116 can be coupled to a second RF source 160 using a second match network 162. Alternately, a match network is not required.

The second RF source 160 provides a bottom RF signal (BRF) to the lower electrode 116, and the second RF source 160 can operate in a frequency range from approximately 0.1 MHz. to approximately 200 MHz. The BRF signal can be in the frequency range from approximately 0.2 MHz. to approximately 30 MHz, or alternatively, in the frequency range from approximately 0.3 MHz. to approximately 15 MHz. The second RF source can operate in a power range from approximately 0.1 watts to approximately 1000 watts, or alternatively, the second RF source can operate in a power range from approximately 0.1 watts to approximately 500 watts. The lower electrode 116 may be the sole source of plasma within the chamber, or may augment any additional plasma source.

PECVD system 100 can further comprise a translation device 150 that can be coupled by a bellows 154 to the processing chamber 110. Also, coupling assembly 152 can couple translation device 150 to the substrate holder 130. Bellows 154 is configured to seal the vertical translation device from the atmosphere outside the processing chamber 110.

Translation device 150 allows a variable gap 104 to be established between the shower plate assembly 120 and the substrate 135. The gap can range from approximately 1 mm to approximately 200 mm, or alternatively, the gap can range from approximately 2 mm to approximately 80 mm. The gap can remain fixed or the gap can be changed during a deposition process.

Additionally, substrate holder 130 can further comprise a focus ring 106 and ceramic cover 108. Alternately, a focus ring 106 and/or ceramic cover 108 are not required.

At least on chamber wall 112 can comprise a coating 114 to protect the wall. Coating 114 can comprise a ceramic material. Alternately, coating 114 is not required.

In addition, the temperature control system can be used to control the chamber wall temperature. For example, ports 180 can be provided in the chamber wall for controlling temperature. Chamber wall temperature can be maintained relatively constant while a process is being performed in the chamber.

Also, the temperature control system can be used to control the temperature of the upper electrode. Temperature control elements 142 can be used to control the upper electrode temperature. Upper electrode temperature can be maintained relatively constant while a process is being performed in the chamber.

In addition, PECVD system 100 can also comprise a remote plasma system 175 that can be used for chamber cleaning.

Furthermore, PECVD system 100 can also comprise a purging system (not shown) that can be used for controlling contamination and/or chamber cleaning.

In an alternate embodiment, processing chamber 110 can, for example, further comprise a monitoring port (not shown). A monitoring port can, for example, permit optical monitoring of process space 102.

PECVD system 100 also comprises a controller 190. Controller 190 can be coupled to chamber 110, shower plate assembly 120, substrate holder 130, gas supply system 131, upper electrode 140, first RF match 144, first RF source 146, translation device 150, ESC supply 156, heater supply 158, second RF match 162, second RF source 160, dry pump 170, remote plasma device 175, and pressure control system 118. The controller can be configured to provide control data to these components and receive data such as process data from these components. For example, controller 190 can comprise a microprocessor, a memory, and a digital I/O port capable of generating control voltages sufficient to communicate and activate inputs to the processing system 100 as well as monitor outputs from the PECVD system 100. Moreover, the controller 190 can exchange information with system components. Also, a program stored in the memory can be utilized to control the aforementioned components of a PECVD system 100 according to a process recipe. In addition, controller 190 can be configured to analyze the process data, to compare the process data with target process data, and to use the comparison to change a process and/or control the deposition tool. Also, the controller can be configured to analyze the process data, to compare the process data with historical process data, and to use the comparison to predict, prevent, and/or declare a fault.

Figure 2A:
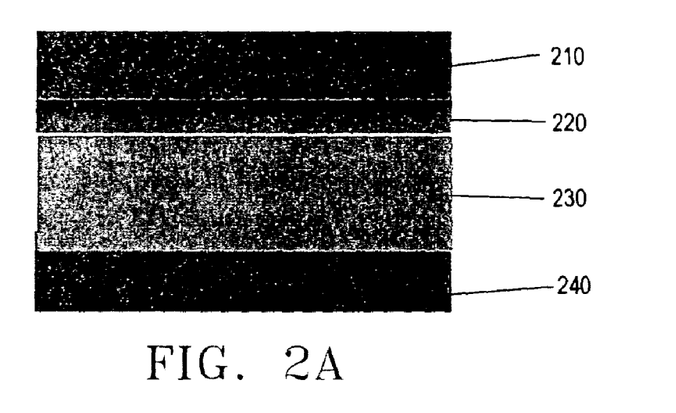
FIGS. 2A-2C show a simplified procedure for using a TERA layer in accordance with an embodiment of the present invention.
Figure 2B:
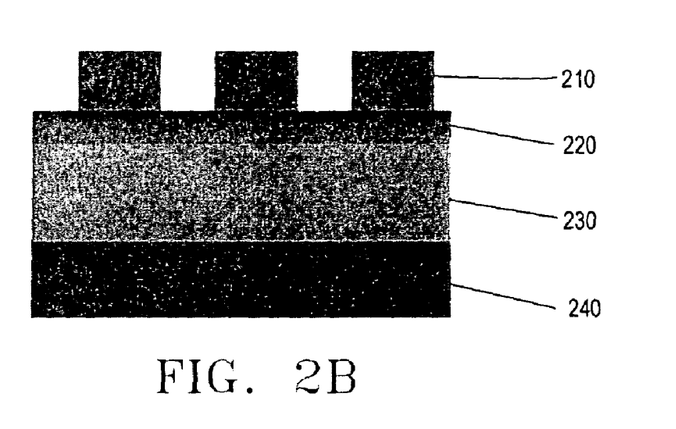
Figure 2C:
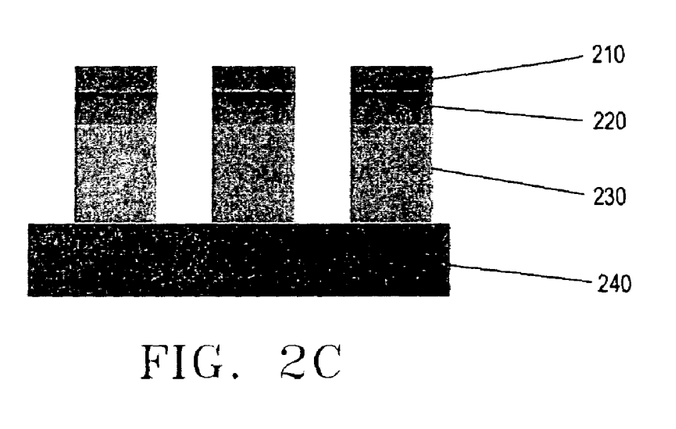

FIGS. 2A-2C show a simplified procedure for using a TERA layer in accordance with an embodiment of the present invention. FIG. 2A shows a photoresist layer 210 on a TERA layer, which comprises a TERA cap layer 220 and a TERA bottom layer 230. For example, the TERA cap layer 220 can be a layer having a thickness of approximately 150 A to approximately 1000 A, and the TERA bottom layer can be a layer having a thickness of approximately 300 A to approximately 5000 A. In this example, the TERA bottom layer 230 is coupled to an oxide layer 240. This is not required for the invention, and the TERA layer may be deposited on materials other than oxide. Although two layers are shown in FIG. 2, this is not required for the invention. A TERA stack can comprise one or more layers.

In FIG. 2B, the photoresist layer 210 has been processed using at least one lithography step and at least one development step.

In FIG. 2C, the TERA layer has been opened using at least one etch-related process.

Figure 3:
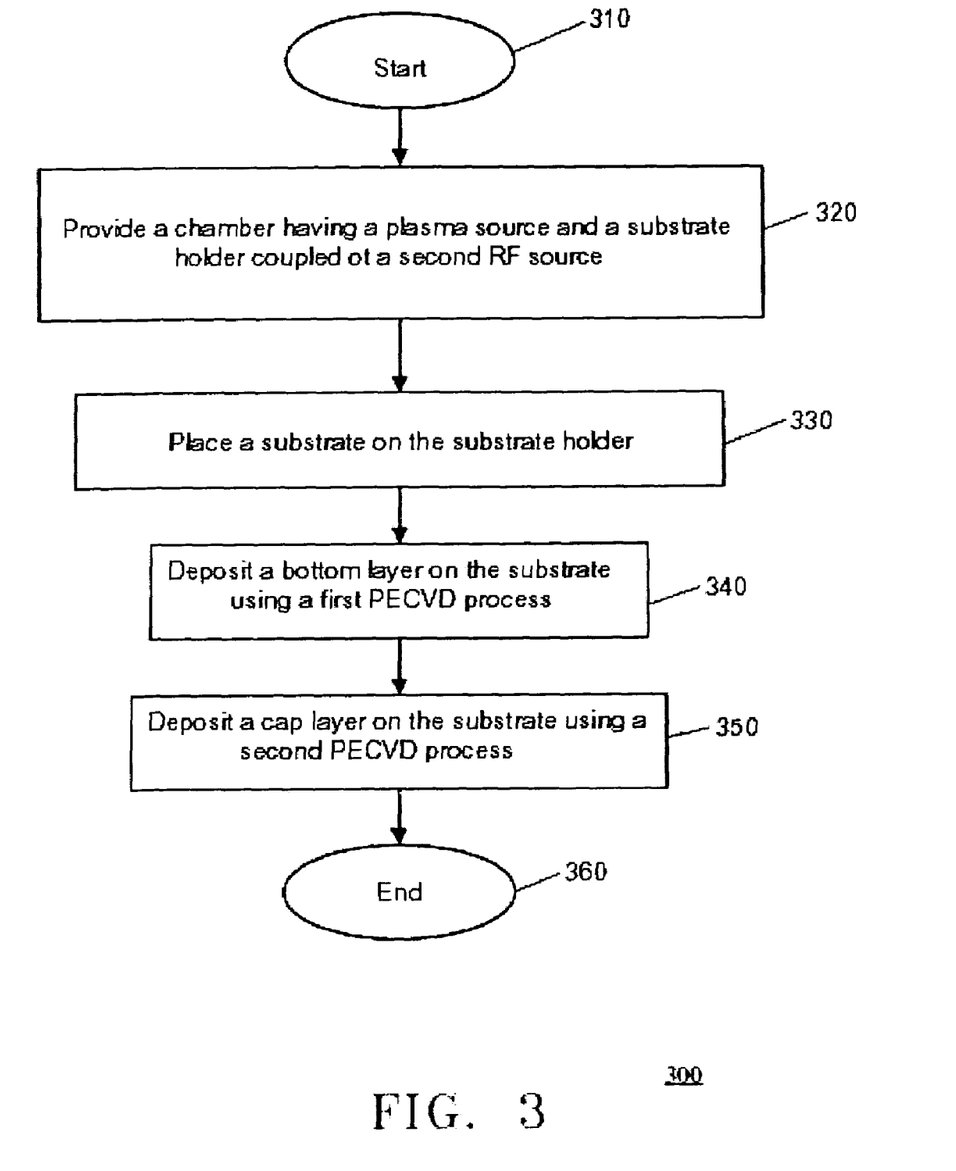
FIG. 3 shows a simplified flow diagram of a procedure for depositing a TERA layer on a substrate in accordance with an embodiment of the present invention.

FIG. 3 shows a simplified flow diagram of a procedure for depositing a TERA layer on a substrate in accordance with an embodiment of the present invention. For example, a TERA layer can comprise a bottom layer and a cap layer that can be deposited using different processes. Procedure 300 starts in 310.

In 320, a chamber can be provided, and the chamber can comprise a plasma source and an optionally translatable substrate holder coupled to a second RF source.

In 330, a substrate is placed on the translatable substrate holder. For example, the translatable substrate holder can be used to establish a gap between an upper electrode surface and a surface of the translatable substrate holder. The gap can range from approximately 1 mm to approximately 200 mm, or alternatively, the gap can range from approximately 2 mm to approximately 80 mm. The gap size can be changed to change the deposition rate. For example, the gap can be increased to decrease the deposition rate, and the gap can be decreased to increase the deposition rate. The gap size can also be varied to prevent arcing during plasma processes.

In 340, a bottom layer can be deposited on the substrate, wherein the rate of deposition is dependent upon the position of the translatable substrate holder, the amount of RF power provided by the first RF source, and the amount of RF power provided by the second RF source.

During the bottom layer deposition process, a TRF signal can be provided to the upper electrode using the first RF source. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 10 watts to approximately 10000 watts, or alternatively, the first RF source can operate in a power range from approximately 10 watts to approximately 5000 watts.

Also, during the bottom layer deposition process, a BRF signal can be provided to the lower electrode using the second RF source. For example, the second RF source can operate in a frequency range from approximately 0.1 MHz. to approximately 200 MHz. Alternatively, the second RF source can operate in a frequency range from approximately 0.2 MHz. to approximately 30 MHz, or the second RF source can operate in a frequency range from approximately 0.3 MHz. to approximately 15 MHz. The second RF source can operate in a power range from approximately 0.1 watts to approximately 1000 watts, or alternatively, the second RF source can operate in a power range from approximately 0.1 watts to approximately 500 watts.

In addition, a shower plate assembly can be provided in the processing chamber and can be coupled to the upper electrode. The shower plate assembly can comprise a center region and an edge region, and the shower plate assembly can be coupled to a gas supply system. A first process gas can be provided to the center region, and a second process gas can be provided to the edge region during the bottom layer deposition process.

Alternately, the center region and the edge region can be coupled together as a single primary region, and gas supply system can provide the first process gas and/or the second process gas to the primary region. In fact, any of the regions can be coupled together and the gas supply system can provide one or more process gasses.

The first process gas can comprise at least one of a silicon-containing precursor and a carbon-containing precursor. An inert gas can also be included. For example, the flow rate for the silicon-containing precursor and the-carbon containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor can comprise at least one of $CH_4$, $C_2H_4$, $C_2H_2$, $C_6H_6$ and $C_6H_5OH$. The inert gas can be argon, helium, and/or nitrogen.

The second process gas can comprise at least one of a silicon-containing precursor and a carbon-containing precursor. An inert gass can also be included. For example, the flow rate for the silicon-containing precursor and the carbon-containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor can comprise at least one of $CH_4$, $C_2H_4$, $C_2H_2$, $C_6H_6$ and $C_6H_5OH$. The inert gas can comprise at least one of argon, helium, and nitrogen.

The flow rates for the first process gas and the second process gas can be independently established during the bottom layer deposition process.

The bottom layer can comprise a material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm. The bottom layer can comprise a thickness ranging from approximately 30.0 nm to approximately 500.0 nm, and the deposition rate can range from approximately 100 A/min to approximately 10000 A/min. The bottom layer deposition time can vary from approximately 5 seconds to approximately 180 seconds.

A high deposition rate can be achieved by applying an RF signal to the bottom electrode during the bottom layer deposition process. The RF source can provide a relatively low RF power.

In 350, a cap layer can be deposited on the substrate, wherein the rate of deposition is dependent upon the position of the translatable substrate holder, the amount of RF power provided by the first RF source, and the processing gas.

During the cap layer deposition process, a TRF signal can be provided to the upper electrode using the first RF source. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 10 watts to approximately 10000 watts, or the first RF source can operate in a power range from approximately 10 watts to approximately 5000 watts.

In addition, a shower plate assembly can be provided in the processing chamber and can be coupled to the upper electrode. The shower plate assembly can comprise a center region and an edge region, and the shower plate assembly can be coupled to a gas supply system. A first process gas can be provided to the center region, a second process gas can be provided to the edge region, and a third process gas can be provided to the chamber through third gas region during the cap layer deposition process.

Alternately, the center region and the edge region can be coupled together as a single primary region, and gas supply system can provide the first process gas and/or the second process gas to the primary region. In fact, any of the regions can be coupled together and the gas supply system can provide one or more process gasses.

The first process gas can comprise at least one of a silicon-containing precursor and a carbon-containing precursor. An inert gas can also be included. For example, the flow rate for the silicon-containing precursor and the carbon-containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor can comprise at least one of $CH_4$, $C_2H_4$, $C_2H_2$, $C_6H_6$ and $C_6H_5OH$. The inert gas can comprise at least one of argon, helium, and nitrogen.

The second process gas can comprise at least one of a silicon-containing precursor and a carbon-containing precursor. An inert gas can also be included. For example, the flow rate for the silicon-containing precursor and the carbon-containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor can comprise at least one of $CH_4$, $C_2H_4$, $C_2H_2$, $C_6H_6$ and $C_6H_5OH$. The inert gas can comprise at least one of argon, helium, and nitrogen.

For example, the flow rate for the third process gas can range from approximately 0.0 sccm to approximately 10000 sccm. The third process gas can comprise at least one of an oxygen containing gas, a nitrogen containing gas, and an inert gas. The oxygen containing gas can comprise at least one of $O_2$, CO, NO, $N_2O$, and $CO_2$. The nitrogen containing gas can comprise at least one of $N_2$, and $NF_3$. The inert gas can comprise at least one of Ar and He.

Procedure 300 ends in 360. The cap layer can comprise a material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm.

The cap layer can comprise a thickness ranging from approximately 5.0 nm to approximately 40.0 nm, and the deposition rate can range from approximately 50 A/min to approximately 5000 A/min. The cap layer deposition time can vary from 5 seconds to approximately 180 seconds.

In an alternate embodiment, a BRF signal can be provided to the lower electrode using the second RF source during the cap layer deposition process. For example, the second RF source can operate in a frequency range from approximately 0.1 MHz. to approximately 200 MHz. Alternatively, the second RF source can operate in a frequency range from approximately 0.2 MHz. to approximately 30 MHz, or the second RF source can operate in a frequency range from approximately 0.3 MHz. to approximately 15 MHz. The second RF source can operate in a power range from approximately 0.1 watts to approximately 1000 watts. Alternatively, the second RF source operates in a power range from approximately 0.1 watts to approximately 500 watts.

A pressure control system can be coupled to the chamber, and the chamber pressure can be controlled using the pressure control system. For example, the chamber pressure can range from approximately 0.1 mTorr to approximately 100 Torr.

A temperature control system can be coupled to the substrate holder, and the substrate temperature can be controlled using the temperature control system. For example, the substrate temperature can range from approximately 0° C. to approximately 500° C. The temperature control system can also be coupled to a chamber wall, and the temperature of the chamber wall can be controlled using the temperature control system. For example, the temperature of the chamber wall can range from approximately 0° C. to approximately 500° C. In addition, the temperature control system can be coupled to the shower plate assembly; and the temperature of the shower plate assembly can be controlled using the temperature control system. For example, the temperature of the shower plate assembly can range from approximately 0° C. to approximately 5° C.

Furthermore, the substrate holder can comprise an ESC, and a DC voltage can be provided to the ESC to clamp the substrate to the substrate holder. For example, the DC voltage can range from approximately −2000 V. to approximately +2000 V.

Figure 4:
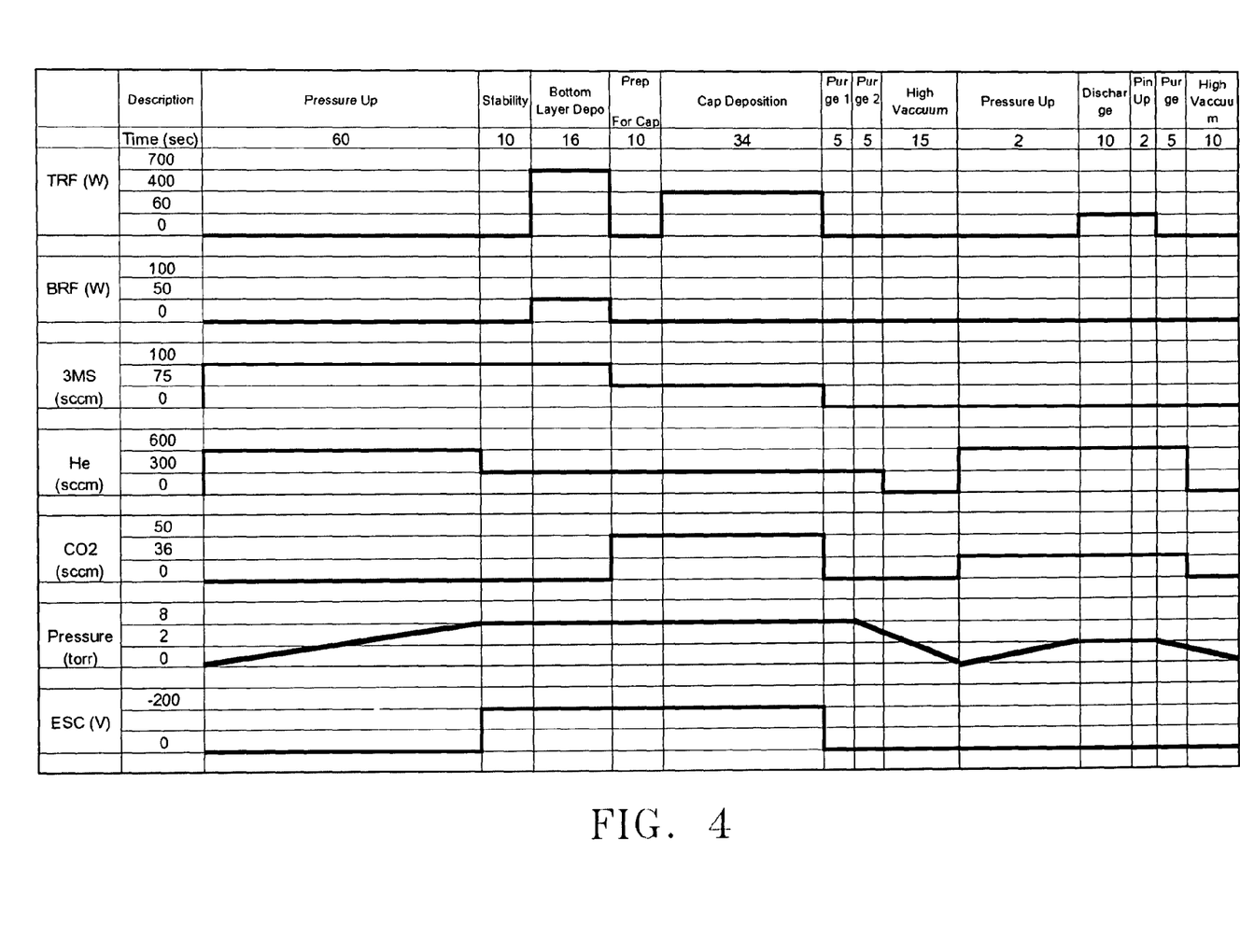
FIG. 4 shows an exemplary set of processes used in a procedure for depositing a TERA layer on a substrate in accordance with an embodiment of the present invention.

FIG. 4 shows an exemplary set of processes used in a procedure for depositing a TERA layer on a substrate in accordance with an embodiment of the present invention. In the first step, processing gases are introduced into the chamber, and an operating pressure is established. For example, the chamber pressure can be established at approximately 8 Torr, and the duration of the first step can be sixty seconds. The processing gases can include a silicon-containing precursor, a carbon-containing precursor and an inert gas. In alternate embodiments, different pressures can be used, and different durations can be used.

In the second step, a stabilization process can be performed. For example, the flow rate of one or more of the processing gases can be changed, and a clamping voltage can be applied to the ESC.

In the third step, the bottom layer portion of the TERA layer can be deposited. A first RF source can provide an RF signal (TRF) to the upper electrode, and a second RF source can provide an RF signal (BRF) to the bottom electrode, which can be part of the substrate holder. For example, the TRF frequency can be in the range from approximately 0.1 MHz to approximately 200 MHz and the TRF power can be in the range from approximately 10 watts to approximately 10000 watts. Also, the BRF frequency can be in the range from approximately 0.1 MHz to approximately 200 MHz and the BRF power can be in the range from approximately 0.1 watts to approximately 1000 watts. The BRF signal provides control of the deposition rate during the bottom layer deposition process. In the illustrated embodiment (FIG. 4), the TRF frequency was approximately 13.56 MHz; the TRF power was approximately 700 watts; the BRF frequency was approximately 2 MHz; the BRF power was approximately 50 watts; and the ESC voltage was approximately −200 V. In alternate embodiments, different frequencies, power levels, and clamping voltages can be used.

In the fourth step, a preparation process can be performed. The TRF and BRF signal levels can be altered, the processing gasses can be changed, and flow rates can be modified.

In the illustrated embodiment (FIG. 4), the TRF signal was turned off; the BRF signal was turned off; and the ESC voltage was approximately −200 V. Also, the flow rate of the silicon-containing precursor was changed, and an oxygen-containing gas was supplied to the processing chamber. Alternatively, the plasma can be turned off and the pressure in the chamber can range from about 1 mTorr to about 20 Torr, with the process gas comprising at least one of a silicon-containing precursor, a carbon-containing precursor, an oxygen containing gas, and an inert gas. Or, the plasma can be maintained with an inert gas being provided to the chamber. Alternatively, the fourth step between the depositing of the bottom layer and the depositing of the cap layer can be eliminated so that the depositing of the cap layer occurs immediately after the depositing of the bottom layer.

In the fifth step, the cap layer portion of the TERA layer can be deposited. The first RF source can provide an RF signal (TRF) to the upper electrode, and a different combination of processing gases can be provided to the processing chamber. For example, the TRF frequency can be in the range from approximately 0.1 MHz to approximately 200 MHz and the TRF power can be in the range from approximately 10 watts to approximately 10000 watts. In addition, the combination of processing gases can include a silicon-containing precursor, a carbon-containing precursor, an oxygen-containing gas, and an inert gas. In the illustrated embodiment (FIG. 4), the TRF frequency was approximately 13.56 MHz; the TRF power was approximately 400 watts; the ESC voltage was approximately −200 V; the silicon-containing precursor comprised 3MS, the oxygen-containing gas comprised $CO_2$, and the inert gas comprised He. In alternate embodiments, different frequencies, power levels, and gases can be used.

In steps six and seven, purging processes can be performed. For example, the flow rate of one or more of the processing gases can be changed; the TRF signal can be altered; the ESC voltage can be changed; and the pressure can be modified. In the illustrated embodiment (FIG. 4), the TRF signal was turned off; the flow rate of the silicon-containing precursor was set to zero; the flow rate of the oxygen-containing gas was set to zero; the flow rate of the inert gas was held constant; and the ESC voltage was set to zero.

In the eighth step, the chamber is evacuated and the pressure is lowered. For example, processing gas is not provided to the chamber during this step.

In the ninth step, the chamber pressure can be increased. For example, one or more processing gases can be supplied to the processing chamber and the chamber pressure can be maintained at a predetermined level. In the illustrated embodiment (FIG. 4), the RF signals are turned off; the flow rate of the silicon-containing precursor was set to zero; the flow rate of the carbon-containing precursor was set to zero; the flow rate of the oxygen-containing gas was set to approximately 36 sccm; the flow rate of the inert gas was set to approximately 600 sccm; and the chamber pressure was maintained at approximately 2 Torr.

In the tenth step, a discharge process can be performed. For example, a TRF signal can be used to establish plasma. In the illustrated embodiment (FIG. 4), the TRF signal was turned on; the flow rate of the silicon-containing precursor was set to zero; the flow rate of the carbon-containing precursor was set to zero; the flow rate of the oxygen-containing gas was set to approximately 36 sccm; the flow rate of the inert gas was set to approximately 600 sccm; and the chamber pressure was maintained at approximately 2 Torr.

In the eleventh step, a pin up process can be performed. For example, the lift pins can be extended to lift the substrate off the substrate holder.

In the twelfth step, a purging process can be performed. For example, the TRF signal can be altered, and the chamber pressure can be changed. In the illustrated embodiment (FIG. 4), the TRF signal was turned off; the flow rate of the silicon-containing precursor was set to zero; the flow rate of the carbon-containing precursor was set to zero; the flow rate of the oxygen-containing gas was set to approximately 36 sccm; the flow rate of the inert gas was set to approximately 600 sccm; and the chamber pressure was decreased from approximately 2 Torr.

In the thirteenth step, the chamber is evacuated and the pressure is lowered. For example, processing gas is not provided to the chamber during this step.

The above example illustrates that a TERA layer can be deposited by using a PECVD procedure to deposit a bottom layer and a cap layer wherein the application of a small amount of secondary RF power to the bottom electrode can increase the deposition rate during the bottom layer deposition process.

In this embodiment, TERA bottom layer and cap layer are deposited sequentially in one chamber. During the period between bottom and cap layer deposition, the plasma is turned off. In an alternate embodiment, TERA bottom layer and cap layer can be deposited sequentially in the same chamber without turning off the plasma. In an alternate embodiment, TERA bottom layer and cap layer can be deposited in separate chambers.

In this embodiment, the chamber is kept at a specific pressure between bottom layer and top layer deposition. In an alternate embodiment, the chamber may be evacuated between deposition of the layers.

These embodiments provide a dramatic increase in the deposition rate by applying a small amount of RF power to the bottom electrode. Previous processing systems have used higher RF power to the bottom electrode to provide an etching component to the process.

The data shown in Table 1 illustrate processing conditions for exemplary embodiments of the invention. Processing conditions for Film A and Film B were identical except Film B was deposited using a low power backside RF. The deposition rate for Film B was over 2 times, indeed, almost 3 times higher than that for Film A. In addition, the density of Film B as measured by Rutherford Backscattering Spectroscopy (RBS) is significantly higher than that of Film A. Differences in refractive index and extinction coefficient for the two films were also observed. From this example, the effect of low power backside RF on deposition rate and film properties is evident.

TABLE 1

| Film A | Film B |
| --- | --- |
| Without Bottom RF | With Bottom RF |
| TRF = 700 W | TRF = 700 W |
| BRF = 0 W | BRF = 50 W |
| Gap = 48 mm | Gap = 48 mm |
| P = 8 Torr | P = 8 Torr |
| 3MS flow = 100 sccm | 3MS flow = 100 sccm |
| He flow = 300 sccm | He flow = 300 sccm |
| Heater T = 235 C. | Heater T = 235 C. |
| Rate = 1180 A/min | Rate = 3470 A/min |
| Refractive Index @ 193 nm = 1.90 | Refractive Index @ 193 nm = 1.95 |
| Extinction Coefficient @ 193 nm = 0.38 | Extinction Coefficient @ 193 nm = 0.46 |
| Film density = 1.3 g/cm$^3$ | Film density = 1.5 g/cm$^3$ |

Advances in photoresist techniques require advanced bottom anti-reflective coating (BARC) layers. The present invention provides a means for depositing TERA stacks having advanced BARC layer properties. For example, the TERA stack has optical properties to function as an ARC layer at a prescribed wavelength; good etch selectivity with respect to the photoresist, no interaction with the photoresist, and can serve as hardmask layer for subsequent etching operations. In addition, the TERA stack is oxidizable and can be stripped using a wet etch process.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for depositing a material on a substrate, the method comprising:
    placing a substrate in a chamber having a plasma source and on a substrate holder coupled to a RF source;
    depositing a Tunable Etch Resistant ARC (TERA) layer on the substrate using PECVD, wherein the amount of RF power provided by the RF source is selected such that the rate of deposition of at least one portion of the TERA layer is greater than when no RF power is applied the substrate holder;
    providing a first process gas to a center region of a shower plate assembly coupled to the upper electrode at a first flow rate; and
    providing a second process gas to an edge region of the shower plate assembly at a second flow rate.

2. The method as claimed in claim 1, wherein the plasma source has an upper electrode, the method further comprising:
    establishing a gap between an upper electrode surface and a surface of the translatable substrate holder.

3. The method as claimed in claim 2, wherein the gap ranges from approximately 1 mm to approximately 200 mm.

4. The method as claimed in claim 3, wherein the gap ranges from approximately 2 mm to approximately 80 mm.

5. The method as claimed in claim 1, wherein the depositing of the TERA layer comprises:
    depositing a bottom layer during a first deposition time, wherein the bottom layer comprises a material having a refractive index (n) ranging from approximately 1.5 to approximately 2.5 when measured at a wavelength of at least one of: 248 nm, 193 nm, and 157 nm and having an extinction coefficient (k) ranging from approximately 0.10 to approximately 0.9 when measured at a wavelength of at least one of: 248 nm, 193 nm, and 157 nm; and
    depositing a cap layer during a second deposition time, wherein the cap layer comprises a material having a refractive index (n) ranging from approximately 1.5 to approximately 2.5 when measured at a wavelength of at least one of: 248 nm, 193 nm, and 157 nm and having an extinction coefficient (k) ranging from approximately 0.10 to approximately 0.9 when measured at a wavelength of at least one of: 248 nm, 193 nm, and 157 nm.

6. The method as claimed in claim 5, wherein the bottom layer has a thickness ranging from approximately 30.0 nm to approximately 500.0 nm.

7. The method as claimed in claim 5, wherein the plasma source has an additional RF source and the depositing of the bottom layer further comprises:
    operating the additional RF source in a frequency range from approximately 0.1 MHz. to approximately 200 MHz; and
    operating the RF source in a frequency range from approximately 0.1 MHz. to approximately 200 MHz.

8. The method as claimed in claim 7, wherein:
    the additional RF source is operated in a frequency range from approximately 1 MHz. to approximately 100 MHz; and
    the RF source is operated in a frequency range from approximately 0.2 MHz. to approximately 30 MHz.

9. The method as claimed in claim 8, wherein:
    the additional RF source is operated in a frequency range from approximately 2 MHz. to approximately 60 MHz; and
    the RF source is operated in a frequency range from approximately 0.3 MHz. to approximately 15.0 MHz.

10. The method as claimed in claim 5, wherein the plasma source has an additional RF source and the depositing of the bottom layer further comprises:
    operating the additional RF source in a power range from approximately 10 watts to approximately 10000 watts; and
    operating the RF source in a power range from approximately 0.1 watts to approximately 1000 watts.

11. The method as claimed in claim 10, wherein:
    the additional RF source is operated in a power range from approximately 10 watts to approximately 5000 watts; and
    the RF source is operated in a power range from approximately 0.1 watts to approximately 500 watts.

12. The method as claimed in claim 5, wherein the depositing of the bottom layer occurs at a rate from approximately 100 A/mm to approximately 10000 A/mm.

13. The method as claimed in claim 5, wherein the first deposition time varies from approximately 5 seconds to approximately 180 seconds.

14. The method as claimed in claim 5, wherein the depositing of the bottom layer further comprises:
    providing a first process gas, wherein the first process gas comprises at least one of a silicon-containing precursor and a carbon-containing precursor.

15. The method as claimed in claim 14, wherein the providing of the first process gas comprises flowing the silicon-containing precursor and/or the carbon-containing precursor at a first rate ranging from approximately 0.0 sccm to approximately 5000 sccm.

16. The method as claimed in claim 14, wherein the silicon-containing precursor comprises at least one of monosilane ($SiH_4$) tetraethylorthosilicate (TEOS), monomethylsilane (1MS), dimethylsilane (2MS), trimethylsilane (3MS), tetramethylsilane (4MS), octamethylcyclotetrasiloxane (OMCTS),and tetranuethylcyclotetrasilane (TMCTS).

17. The method as claimed in claim 14, wherein the carbon-containing precursor comprises at least one of $CH_4$, $C_2H_4$, $C_2H_2$, $C_6H_6$ and $C_6H_5OH$.

18. The method as claimed in claim 14, wherein the first process gas includes an inert gas comprising at least one of argon, helium, and nitrogen.

19. The method as claimed in claim 5, wherein the depositing of the bottom layer further comprises:
    controlling chamber pressure using a pressure control system, wherein the chamber pressure ranges from approximately 0.1 mTorr to approximately 100 Torr.

20. The method as claimed in claim 19, wherein the chamber pressure ranges from approximately 0.1 Torr to approximately 20 Torr.

21. The method as claimed in claim 5, wherein the depositing of the bottom layer further comprises:
providing a DC voltage to an electrostatic chuck (ESC) coupled to the substrate holder to clamp the substrate to the substrate holder, wherein the DC voltage ranges from approximately −2000 V. to approximately +2000 V.

22. The method as claimed in claim 21, wherein the DC voltage ranges from approximately −1000 V. to approximately −+1000 V.

23. The method as claimed in claim 5, wherein the cap layer has a thickness ranging from approximately 5.0 nm to approximately 400 nm.

24. The method as claimed in claim 5, wherein the plasma source includes an additional RF source and the depositing of the cap layer further comprises:
operating the RF source in a frequency range from approximately 0.1 MHz. to approximately 200 MHz.

25. The method as claimed in claim 24, wherein the depositing a cap layer further comprises:
operating the RF source in a frequency range from approximately 0.1 MHz. to approximately 200 MHz.

26. The method as claimed in claim 5, wherein the plasma source includes an additional RF source and the depositing of the cap layer further comprises:
operating the additional RF source in a power range from approximately 10 watts to approximately 10000 watts.

27. The method as claimed in claim 26, wherein the depositing of the cap layer further comprises:
operating the RF source in a power range from approximately 0.1 watts to approximately 1000 watts.

28. The method as claimed in claim 5, wherein the depositing of the cap layer occurs at a rate from approximately 50 A/mm to approximately 5000 A/mm.

29. The method as claimed in claim 5, wherein the second deposition time varies from approximately 5 seconds to approximately 180 seconds.

30. The method as claimed in claim 14, wherein the depositing of the cap layer further comprises:
providing a second process gas, wherein the second process gas comprises at least one of a silicon-containing precursor and a carbon-containing precursor, and an oxygen containing gas.

31. The method as claimed in claim 30, wherein the silicon-containing precursor and/or the carbon-containing precursor are flowed at a first rate ranging from approximately 0.0 sccm to approximately 5000 sccm, and/or the oxygen containing precursor is flowed at a second rate ranging from approximately 0.0 sccm to approximately 10000 sccm.

32. The method as claimed in claim 30, wherein the silicon-containing precursor comprises at least one of monosilane ($SiN_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS).

33. The method as claimed in claim 30, wherein the carbon-containing precursor comprises at least one of $CH_4$, $C_2H_4$, $C_2H_2$, $C_6H_6$ and $C_6H_5OH$.

34. The method as claimed in claim 30, wherein the oxygen containing gas comprises at least one of $O_2$, CO, NO, $N_2O$, and $CO_2$.

35. The method as claimed in claim 30, wherein the second process gas includes an inert gas, the inert gas comprising at least one of argon, helium, and nitrogen.

36. The method as claimed in claim 5, further comprising:
turning off a plasma between the deposition of the bottom layer and the cap layer while maintaining the chamber at a pressure between approximately 1 mTorr and approximately 20 Torr, with the process gas comprising at least one of a silicon-containing precursor, a carbon-containing precursor, an oxygen containing gas, and an inert gas.

37. The method as claimed in claim 5, wherein the depositing of the bottom layer and the deposition of the cap layer further occur in separate chambers.

38. The method as claimed in claim 5, wherein the depositing of the bottom layer and the deposition of the cap layer occur sequentially in the same chamber while keeping a plasma on throughout the sequential deposition, with the process gas comprising at least one of a silicon-containing precursor and a carbon-containing precursor.

39. The method as claimed in claim 5, wherein a plasma is maintained between the deposition of the bottom layer and the deposition of the cap layer and the reactor ambient between the depositions comprises an inert gas.

40. The method as claimed in claim 5, wherein the depositing of the bottom layer and the deposition of the cap layer occur in one chamber and between depositions, a plasma is turned off and the chamber is subjected to a sequence of evacuations and gas purges.

41. The method as claimed in claim 1, wherein the first process gas comprises at least one of a silicon-containing precursor, and a carbon-containing precursor, and the second process gas comprises at least one of a silicon-containing precursor, and a carbon-containing precursor.

42. The method as claimed in claim 1, wherein the shower plate assembly further comprises a sub region and a third process gas is provided to the sub region.

43. The method as claimed in claim 42, wherein the third process gas comprises at least one of an oxygen containing gas, a carbon containing gas, a nitrogen containing gas, and an inert gas.

44. A method for depositing a material on a substrate, the method comprising:
placing a substrate in a chamber having a plasma source and on a substrate holder coupled to a RF source;
depositing a Tunable Etch Resistant ARC (TERM layer on the substrate using PECVD, wherein the amount of RF power provided by the RF source is selected such that the rate of deposition of at least one portion of the TERA layer is greater than when no RF power is applied the substrate holder;
providing a process gas to a primary region of a shower plate assembly coupled to the upper electrode a first flow rate; and
providing another process gas to a sub region of the shower plate assembly at a second flow rate.

45. The method as claimed in claim 44, wherein the process gas comprises at least one of a silicon-containing precursor, and a carbon-containing precursor.

46. The method as claimed in claim 44, wherein the other process gas comprises at least one of an oxygen containing gas, a nitrogen containing gas, a carbon-containing gas, and an inert gas.

47. The method as claimed in claim 1, further comprising:
controlling substrate temperature using a temperature control system coupled to the substrate holder.

48. The method as claimed in claim 47, wherein the substrate temperature ranges from approximately 0 C. to approximately 500 C.

49. The method as claimed in claim 47, further comprising:
controlling the temperature of the at least one chamber wall using the temperature control system.

50. The method as claimed in claim 49, wherein the temperature of the at least one chamber wall ranges from approximately 0 C. to approximately 500 C.

51. The method as claimed in claim 47, further comprising:
controlling the temperature of a shower plate assembly using the temperature control system.

52. The method as claimed in claim 51, wherein the temperature of the shower plate assembly ranges from approximately 0 C. to approximately 500 C.

53. The method as claimed in claim 1, further comprising:
purging the chamber;
creating a low pressure in the chamber; and
performing a de-chucking operation.

54. The method as claimed in claim 53, wherein the de-chucking operation comprises
providing a process gas.

55. The method as claimed in claim 54, wherein the process gas comprises at least one of an oxygen containing gas, and a carbon-containing precursor.

56. The method as claimed in claim 1, wherein the deposition of the TERA layer on the substrate includes depositing at least two layers as the TERA layer.

57. The method as claimed in claim 1, wherein the characteristics of the TERA layer are dependent upon the amount of RF power provided by the RF source.

58. The method as claimed in claim 57, wherein the density of the TERA layer is greater than when no RF power is applied the substrate holder.

* * * * *